US012612713B2

(12) United States Patent
Lin et al.

(10) Patent No.: US 12,612,713 B2
(45) Date of Patent: Apr. 28, 2026

(54) SILICON CARBIDE WAFER AND METHOD OF FABRICATING THE SAME

(71) Applicant: GlobalWafers Co., Ltd., Hsinchu (TW)

(72) Inventors: Ching-Shan Lin, Hsinchu (TW); Chien-Cheng Liou, Hsinchu (TW); Jian-Hsin Lu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 1049 days.

(21) Appl. No.: 17/385,924

(22) Filed: Jul. 27, 2021

(65) Prior Publication Data

US 2022/0025549 A1     Jan. 27, 2022

Related U.S. Application Data

(60) Provisional application No. 63/139,270, filed on Jan. 19, 2021, provisional application No. 63/056,732, filed on Jul. 27, 2020.

(51) Int. Cl.
| | |
|---|---|
| *C30B 29/36* | (2006.01) |
| *C01B 32/956* | (2017.01) |
| *C30B 23/00* | (2006.01) |
| *C30B 23/06* | (2006.01) |
| *C30B 25/10* | (2006.01) |
| *C30B 25/16* | (2006.01) |

(Continued)

(52) U.S. Cl.
CPC ............ *C30B 29/36* (2013.01); *C01B 32/956* (2017.08); *C30B 23/002* (2013.01); *C30B 23/066* (2013.01); *C30B 25/10* (2013.01); *C30B 25/165* (2013.01); *H10D 62/60*

(2025.01); *H10D 62/8325* (2025.01); *C01P 2002/52* (2013.01); *C01P 2006/10* (2013.01); *C01P 2006/40* (2013.01)

(58) Field of Classification Search
None
See application file for complete search history.

(56) References Cited

U.S. PATENT DOCUMENTS

| | | | |
|---|---|---|---|
| 7,018,597 B2 | 3/2006 | Ellison et al. | |
| 9,090,989 B2 | 7/2015 | Zwieback et al. | |

(Continued)

FOREIGN PATENT DOCUMENTS

| | | |
|---|---|---|
| CN | 1351680 | 5/2002 |
| CN | 101896646 | 11/2010 |

(Continued)

OTHER PUBLICATIONS

Hao, J., et al., "Growth of 2-inch V-doped bulk 6H—SiC with high semi-insulating yield," Journal of Electronic Materials 39 (2010), 530-533. (Year: 2010).*

(Continued)

*Primary Examiner* — Amber R Orlando
*Assistant Examiner* — Paul Alan Forsyth
(74) *Attorney, Agent, or Firm* — JCIPRNET

(57) ABSTRACT

A silicon carbide wafer and a method of fabricating the same are provided. In the silicon carbide wafer, a ratio (V:N) of a vanadium concentration to a nitrogen concentration is in a range of 2:1 to 10:1, and a portion of the silicon carbide wafer having a resistivity greater than $10^{12}$ $\Omega$·cm accounts for more than 85% of an entire wafer area of the silicon carbide wafer.

3 Claims, 3 Drawing Sheets

(51) Int. Cl.
  *H10D 62/60* (2025.01)
  *H10D 62/832* (2025.01)

(56) References Cited

U.S. PATENT DOCUMENTS

| | | | |
|---|---|---|---|
| 9,322,110 B2 | 4/2016 | Zwieback et al. | |
| 9,601,641 B1 | 3/2017 | Quick et al. | |
| 2002/0104478 A1 | 8/2002 | Oguri et al. | |
| 2008/0038531 A1* | 2/2008 | Sawamura | C30B 23/00 |
| | | | 501/88 |
| 2010/0147212 A1* | 6/2010 | Nakabayashi | H01B 1/00 |
| | | | 117/84 |
| 2011/0266556 A1* | 11/2011 | Leonard | C30B 23/002 |
| | | | 257/77 |
| 2012/0103249 A1 | 5/2012 | Gupta et al. | |
| 2013/0280466 A1* | 10/2013 | Zwieback | B28D 5/00 |
| | | | 428/64.1 |
| 2016/0068994 A1* | 3/2016 | Mueller | C30B 29/36 |
| | | | 252/512 |
| 2017/0321345 A1* | 11/2017 | Xu | C30B 29/36 |
| 2019/0106811 A1* | 4/2019 | Lin | C30B 29/36 |

FOREIGN PATENT DOCUMENTS

| | | | | |
|---|---|---|---|---|
| CN | 102560672 | 7/2012 | | |
| CN | 105209671 | 12/2015 | | |
| CN | 104364428 | 9/2017 | | |
| CN | 104775149 | 9/2017 | | |
| CN | 109628999 | 4/2019 | | |
| CN | 110643965 | 1/2020 | | |
| JP | 2013504513 | 2/2013 | | |
| JP | 2017095319 | 6/2017 | | |
| WO | 2012029952 | 3/2012 | | |
| WO | WO-2013177496 A1 * | 11/2013 | .......... | C30B 23/002 |
| WO | 2018124279 | 7/2018 | | |

OTHER PUBLICATIONS

J. R. Jenny et al., "Deep level transient spectroscopic and Hall effect investigation of the position of the vanadium acceptor level in 4H and 6H SiC," Applied Physics Letters, vol. 68, Issue 14, Apr. 1, 1996, pp. 1963-1965.

V. Balakrishna et al., "Impurity Effects in the Growth of 4H—SiC Crystals by Physical Vapor Transport," MRS Proceedings, vol. 572, Feb. 10, 2011, pp. 245-252.

"Office Action of China Counterpart Application", issued on Jan. 23, 2024, p. 1-p. 8.

"Office Action of Taiwan Counterpart Application", issued on Apr. 13, 2022, p. 1-p. 5.

* cited by examiner

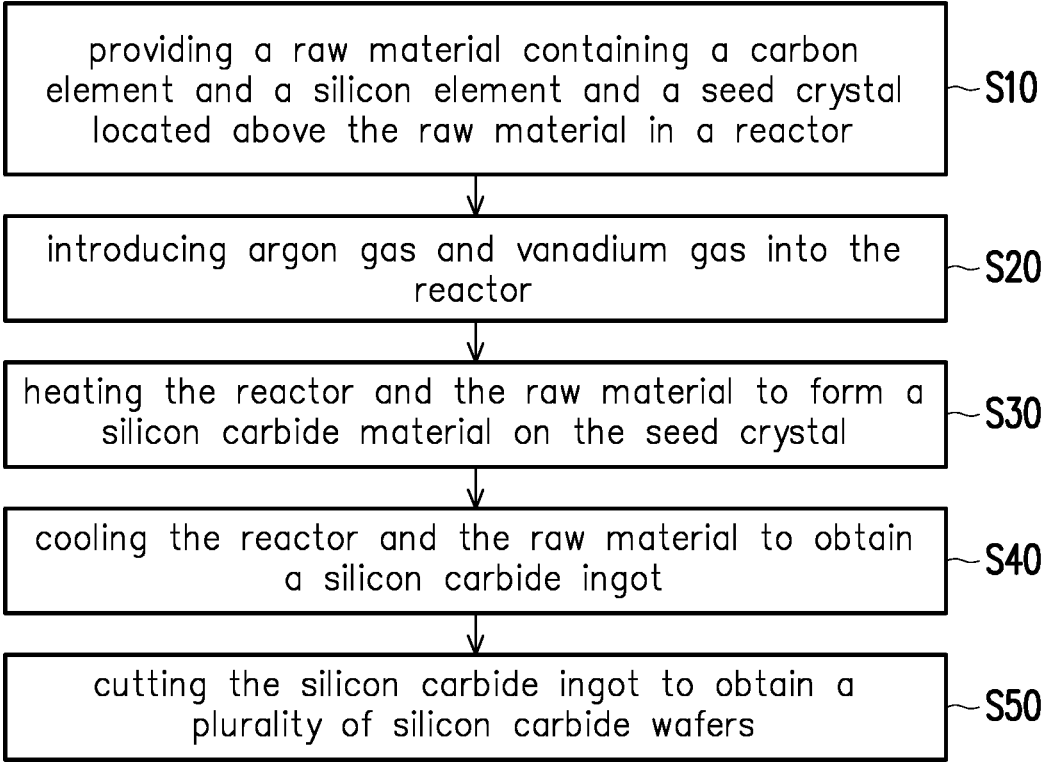

providing a raw material containing a carbon element and a silicon element and a seed crystal located above the raw material in a reactor ~S10 introducing argon gas and vanadium gas into the reactor ~S20 heating the reactor and the raw material to form a silicon carbide material on the seed crystal ~S30 cooling the reactor and the raw material to obtain a silicon carbide ingot ~S40 cutting the silicon carbide ingot to obtain a plurality of silicon carbide wafers ~S50

FIG. 3

SILICON CARBIDE WAFER AND METHOD OF FABRICATING THE SAME

CROSS REFERENCE TO RELATED APPLICATION

This application claims the priority benefit of U.S. provisional application Ser. No. 63/056,732, filed on Jul. 27, 2020, and U.S. provisional application Ser. No. 63/139,270, filed on Jan. 19, 2021. The entirety of each of the above-mentioned patent application is hereby incorporated by reference herein and made a part of specification.

BACKGROUND

Technical Field

The disclosure relates to a silicon carbide wafer, and in particular, relates to a silicon carbide wafer exhibiting high resistivity and a method of fabricating the same.

Description of Related Art

At present, silicon wafers have been widely used in the semiconductor industry. Many electronic devices contain silicon chips which are produced using silicon wafers as materials. However, in order to improve the performance of the chips, many manufacturers currently try to use silicon carbide wafers as materials to produce silicon carbide chips. The silicon carbide chips have the advantages of high temperature resistance and high stability.

As far as the related art is concerned, the fabrication of silicon carbide wafers exhibiting high-resistance is usually accompanied by problems such as uneven distribution of resistivity, difficulty in controlling doping concentrations, and difficulty in controlling purity of silicon carbide. How to fabricate silicon carbide wafers exhibiting high resistance while allowing the resistivity to be evenly distributed and the purity of the silicon carbide to be controlled is an important issue.

SUMMARY

The disclosure provides a silicon carbide wafer and a method of fabricating the same capable of producing a silicon carbide wafer exhibiting high resistance uniformity and high resistivity.

Some embodiments of the disclosure provide a silicon carbide wafer. In the silicon carbide wafer, a ratio (V:N) of a vanadium concentration to a nitrogen concentration is in a range of 2:1 to 10:1, and a portion of the silicon carbide wafer having a resistivity greater than $10^{12}$ $\Omega$·cm accounts for more than 85% of an entire wafer area of the silicon carbide wafer.

In some embodiments, in the silicon carbide wafer, the nitrogen concentration is within a range of $10^{16}$ atom/cm$^3$ to $9.9*10^{16}$ atom/cm$^3$, and the vanadium concentration is within a range of $10^{17}$ atom/cm$^3$ to $9*10^{17}$ atom/cm$^3$.

In some embodiments, in the silicon carbide wafer, the nitrogen concentration is within a range of $10^{16}$ atom/cm$^3$ to $5*10^{16}$ atom/cm$^3$, and the vanadium concentration is within a range of $10^{17}$ atom/cm$^3$ to $3.5*10^{17}$ atom/cm$^3$.

In some embodiments, in the silicon carbide wafer, the nitrogen concentration is within a range of $5*10^{16}$ atom/cm$^3$ to $7*10^{16}$ atom/cm$^3$, and the vanadium concentration is within a range of $3.5*10^{17}$ atom/cm$^3$ to $5*10^{17}$ atom/cm$^3$.

In some embodiments, the ratio (V:N) of the vanadium concentration to the nitrogen concentration is in a range of 4.5:1 to 10:1, and the portion of the silicon carbide wafer having a resistivity greater than $10^{12}$ $\Omega$·cm accounts for more than 90% of the entire wafer area of the silicon carbide wafer.

In some embodiments, the ratio (V:N) of the vanadium concentration to the nitrogen concentration is in a range of 7:1 to 10:1, and the portion of the silicon carbide wafer having a resistivity greater than $10^{12}$ $\Omega$·cm accounts for more than 95% of the entire wafer area of the silicon carbide wafer.

In some embodiments, the ratio (V:N) of the vanadium concentration to the nitrogen concentration is in a range of 8:1 to 10:1, and the portion of the silicon carbide wafer having a resistivity greater than $10^{12}$ $\Omega$·cm accounts for more than 100% of the entire wafer area of the silicon carbide wafer.

In some embodiments, an etch pit density of the silicon carbide wafer is less than 10,000 ea/cm$^2$.

In some embodiments, a micropipe density of the silicon carbide wafer is less than 1 ea/cm$^2$.

Some other embodiments of the disclosure further provide a method of fabricating a silicon carbide wafer, and the method includes the following steps. A raw material containing a carbon element and a silicon element and a seed crystal located above the raw material are provided in a reactor. Argon gas and vanadium gas are introduced into the reactor. The reactor and the raw material are heated to form a silicon carbide material on the seed crystal. The reactor and the raw material are cooled to obtain a silicon carbide ingot. The silicon carbide ingot is cut to obtain a plurality of silicon carbide wafers.

In some embodiments, a flow rate of the argon gas introduced into the reactor is in a range of 70 sccm to 85 sccm.

In some embodiments, a temperature when the vanadium gas is introduced into the reactor is in a range of 2,050° C. to 2,250° C.

To sum up, in the silicon carbide wafer formed through the method of fabricating the same provided by the embodiments of the disclosure, gaseous molecules of vanadium are introduced for doping, and the doping concentration of vanadium and the concentration of nitrogen are under a specific proportional relationship. In this way, the silicon carbide wafer may exhibit high resistance uniformity and high resistivity.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3 is a flow chart of the method of fabricating the silicon carbide wafer according to an embodiment of the disclosure.

DESCRIPTION OF THE EMBODIMENTS

Figure 1:
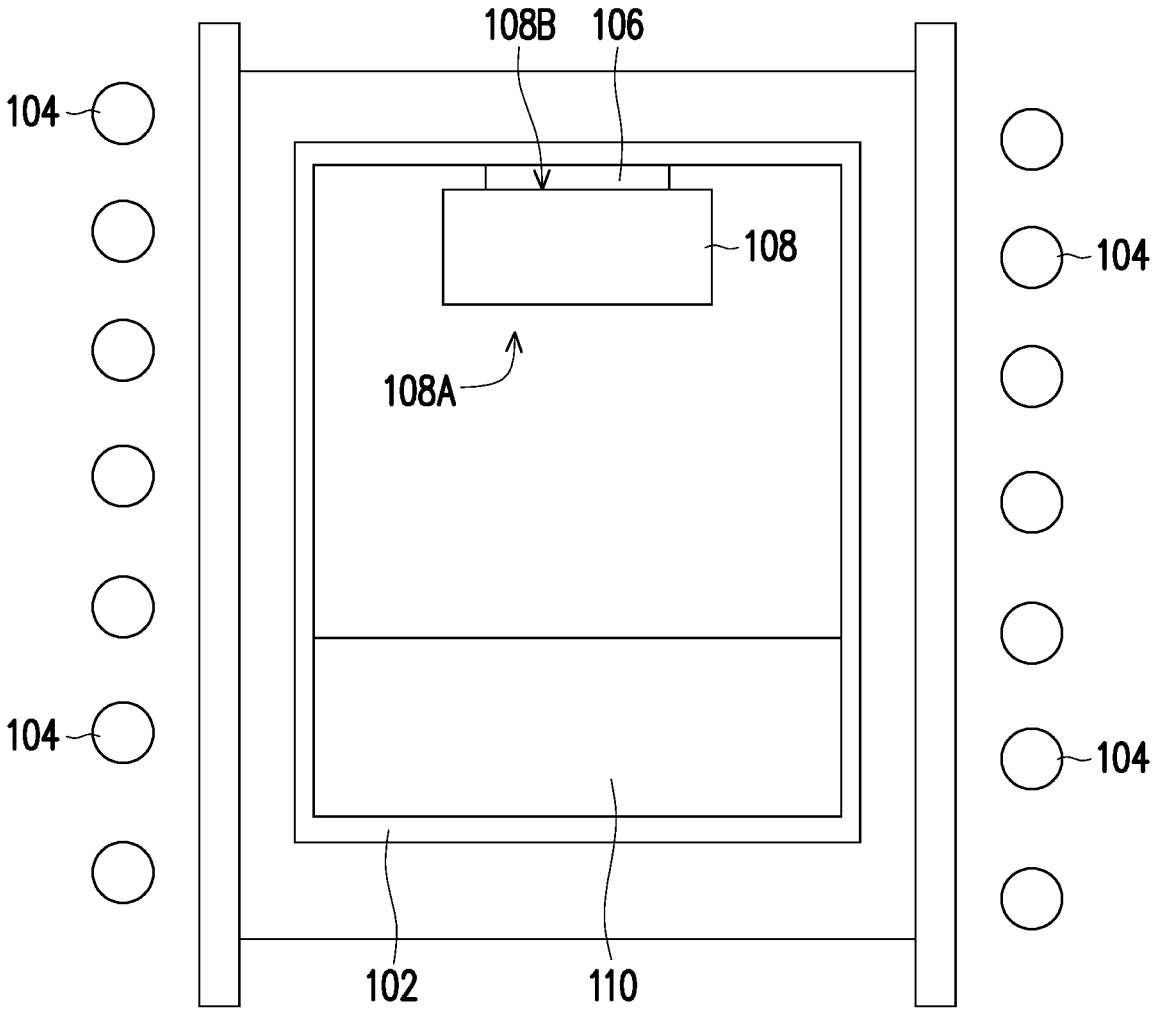
FIG. 1 is a schematic view of a crystal growth apparatus according to an embodiment of the disclosure.
Figure 2A:
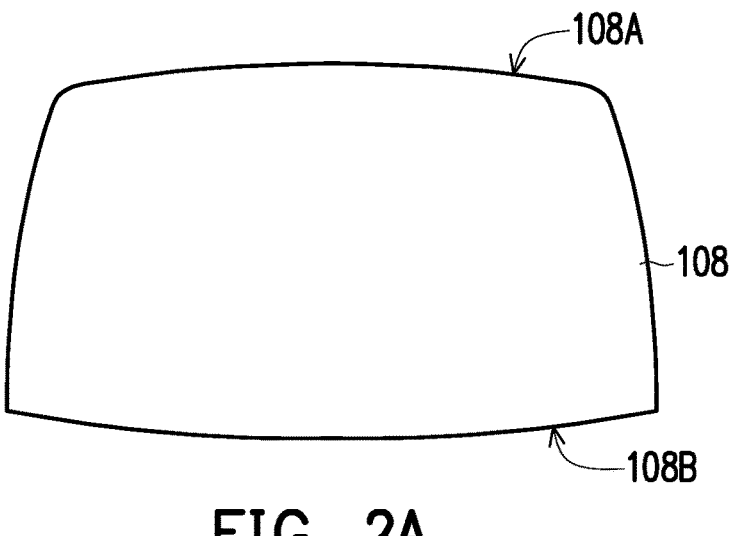
FIG. 2A to FIG. 2C are cross-sectional schematic views of a method of fabricating a silicon carbide wafer according to some embodiments of the disclosure.
Figure 2B:
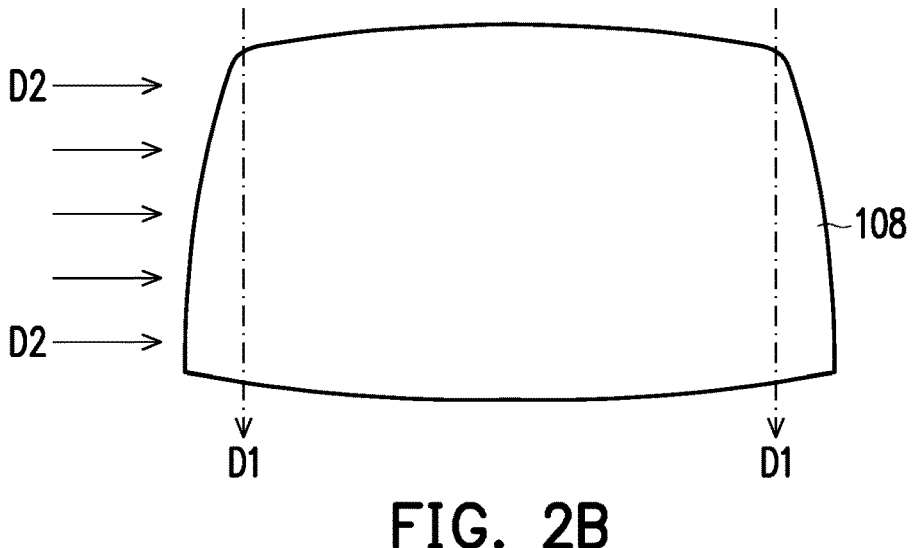
Figure 2C:
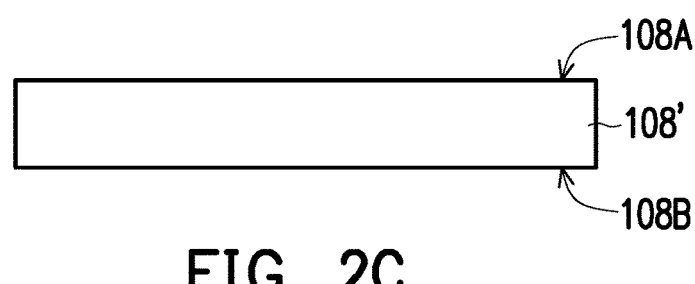

FIG. 1 is a schematic view of a crystal growth apparatus according to an embodiment of the disclosure. FIG. 2A to FIG. 2C are cross-sectional schematic views of a method of fabricating a silicon carbide wafer according to some embodiments of the disclosure. FIG. 3 is a flow chart of the method of fabricating the silicon carbide wafer according to an embodiment of the disclosure. Hereinafter, with reference to the crystal growth apparatus of FIG. 1 and the schematic views of FIG. 2A to FIG. 2C, the method of fabricating the silicon carbide wafer according to some embodiments of the disclosure is described together with the flow chart of FIG. 3.

As shown in FIG. 1 and step S10 of FIG. 3, in a crystal growth process, a raw material 110 containing a carbon element and a silicon element and a seed crystal 106 located above the raw material 110 are provided in a reactor 102. For instance, the raw material 110 is silicon carbide powder and is placed at a bottom of the reactor 102 as a solid evaporation source. The seed crystal 106 is disposed on top of the reactor 102. In some embodiments, the seed crystal 106 may be fixed on a seed crystal carrier (not shown) through an adhesive layer. A material of the seed crystal 106 includes silicon carbide. For instance, the seed crystal 106 is 6H silicon carbide or 4H silicon carbide.

As shown in FIG. 1 and step S20 of FIG. 3, in some embodiments, when the raw material 110 and the seed crystal 106 are disposed in the reactor 102, outside air may enter the reactor 102 together, so that the reactor 102 contains gases such as oxygen and nitrogen. Vanadium gas is thus introduced into the reactor 102, and gaseous molecules of vanadium are used for doping. In this way, the problem of solubility limit caused by the use of solid vanadium may be prevented from occurring.

In some embodiments, a flow rate of argon gas introduced into the reactor 102 is less than 200 sccm. In some embodiments, the flow rate of argon gas introduced into the reactor 102 is less than 150 sccm. In some embodiments, the flow rate of argon gas introduced into the reactor 102 is in a range between 10 sccm and 100 sccm. In some preferred embodiments, the flow rate of argon gas introduced into the reactor 102 is in a range between 70 sccm and 85 sccm. Besides, time for introducing argon gas into the reactor 102 is between 50 hours and 300 hours. In some embodiments, the time for introducing argon gas into the reactor 102 is between 60 hours and 200 hours. In some embodiments, the time for introducing argon gas into the reactor 102 is between 60 hours and 150 hours.

In some embodiments, a temperature when the vanadium gas is introduced into the reactor 102 is in a range between 2,000° C. and 2,300° C. In some embodiments, the temperature when the vanadium gas is introduced into the reactor 102 is in a range between 2,050° C. and 2,250° C. Besides, time for introducing vanadium gas into the reactor 102 is between 50 hours and 300 hours. In some embodiments, the time for introducing vanadium gas into the reactor 102 is between 60 hours and 200 hours. In some embodiments, the time for introducing vanadium gas into the reactor 102 is between 60 hours and 150 hours.

In some embodiments, after the argon gas and vanadium gas are introduced into the reactor 102, a pressure in the reactor 102 is reduced to 0.1 torr to 100 torr, and more preferably the pressure in the reactor 100 torr is 0.1 to 20 torr.

Next, with reference to FIG. 1 and step S30 of FIG. 3, the reactor 102 and the raw material 110 are heated to form a silicon carbide crystal 108 on the seed crystal 106. For instance, the silicon carbide crystal 108 is formed on the seed crystal 106 through physical vapor transport (PVT). In some embodiments, the reactor 102 and the raw material 110 are heated by an induction coil 104 to form the silicon carbide crystal 108 on the seed crystal 106. During a fabrication process, the seed crystal 106 accepts the gaseous solidified raw material 110 (silicon carbide powder) and slowly grows a semiconductor material on the seed crystal 106 until a silicon carbide crystal 108 of an expected size is obtained.

With reference to FIG. 1 and step S40 of FIG. 3, after the silicon carbide crystal 108 grows to the expected size, a silicon carbide ingot may be obtained. The silicon carbide ingot includes a seed end 108B and a dome end 108A opposite to the seed end 108B. Further, the seed end 108B is the end of the silicon carbide ingot close to the seed crystal 106, and the dome end 108A is the end of the silicon carbide ingot away from the seed crystal 106. In some embodiments, the formed ingot may have different crystal structures depending on a crystal orientation of a single crystal seed crystal being used. For instance, ingots of silicon carbide include 4H-silicon carbide, 6H-silicon carbide, and so on. The 4H-silicon carbide and 6H-silicon carbide belong to the hexagonal crystal system.

Next, with reference to step S50 of FIG. 3, as shown in FIG. 2A and FIG. 2B, the silicon carbide ingot (silicon carbide crystal 108) obtained through the crystal growth process is cut to form silicon carbide wafers. As shown in FIG. 2A, the silicon carbide ingot (silicon carbide material 108) may be taken out of the reactor 100. A thickness of the formed silicon carbide ingot is 5 mm to 80 mm, for example, 5 mm to 50 mm or 5 mm to 30 mm. The silicon carbide ingot (silicon carbide material 108) includes a first surface 108A and a second surface 108B opposite to the first surface 108A. The first surface 108A is, for example, a carbon surface (or a dome end), and the second surface 108B is, for example, a silicon surface (or a seed end).

Next, as shown in FIG. 2B, the silicon carbide ingot (silicon carbide material 108) is cut. For instance, corners of the silicon carbide ingot are cut into equal-diameter cylinders along a first direction D1 and are ground into round corners to prevent the corners of the wafer from being broken due to collision. Next, the silicon carbide ingot is sliced along a second direction D2 to cut and separate a plurality of wafers. The slicing method of the silicon carbide ingot (silicon carbide material 108) includes cutting performed by a tool or wire together with abrasive particles (e.g., diamond particles). After the silicon carbide ingot is sliced, ground, and polished, a plurality of silicon carbide wafers 108' as shown in FIG. 2C may be obtained.

In some embodiments, in the formed silicon carbide wafer 108', a ratio (V:N) of a vanadium concentration to a nitrogen concentration is in a range of 2:1 to 10:1. Further, a portion of the silicon carbide wafer 108' having a resistivity greater than $10^{12}$ Ω·cm accounts for more than 85% of an entire wafer area of the silicon carbide wafer 108'. In some embodiments, the ratio (V:N) of the vanadium concentration to the nitrogen concentration is in a range of 4.5:1 to 10:1. The portion of the silicon carbide wafer 108' having a resistivity greater than $10^{12}$ Ω·cm accounts for more than 90% of the entire wafer area of the silicon carbide wafer

108'. In some preferred embodiments, the ratio (V:N) of the vanadium concentration to the nitrogen concentration is in a range of 7:1 to 10:1. Further, the portion of the silicon carbide wafer 108' having a resistivity greater than $10^{12}$ Ω·cm accounts for more than 95% of the entire wafer area of the silicon carbide wafer 108'. In some most preferred embodiments, the ratio (V:N) of the vanadium concentration to the nitrogen concentration is in a range of 8:1 to 10:1. Further, the portion of the silicon carbide wafer 108' having a resistivity greater than $10^{12}$ Ω·cm accounts for more than 100% of the entire wafer area of the silicon carbide wafer 108'.

In some embodiments, in the formed silicon carbide wafer 108', the nitrogen concentration is within a range of $10^{16}$ atom/cm$^3$ to $9.9*10^{16}$ atom/cm$^3$, and the vanadium concentration is within a range of $10^{17}$ atom/cm$^3$ to $9*10^{17}$ atom/cm$^3$. In some embodiments, the nitrogen concentration is within the range of $10^{16}$ atom/cm$^3$ to $5*10^{16}$ atom/cm$^3$, and the vanadium concentration is within a range of $10^{17}$ atom/cm$^3$ to $3.5*10^{17}$ atom/cm$^3$. In still another embodiment, the nitrogen concentration is within a range of $5*10^{16}$ atom/cm$^3$ to $7*10^{16}$ atom/cm$^3$, and the vanadium concentration is within a range of $3.5*10^{17}$ atom/cm$^3$ to $5*10^{17}$ atom/cm$^3$.

In addition, in the embodiments of the disclosure, an etch pit density (EPD) of the formed silicon carbide wafer 108' is less than 10,000 ea/cm$^2$. In some preferred embodiments, the etch pit density of the formed silicon carbide wafer 108' is less than 9,000 ea/cm2. In some embodiments, a micropipe density (MPD) of the formed silicon carbide wafer 108' is less than 1 ea/cm$^2$. In some preferred embodiments, the micropipe density of the formed silicon carbide wafer 108' is less than 0.8 ea/cm$^2$ and preferably equal to 0 ea/cm$^2$.

In order to prove that the method of fabricating the silicon carbide wafer provided by the disclosure may bring a silicon carbide wafer with high resistance uniformity and high resistivity, the following experimental examples are provided for description. Several experiments are listed below to verify the efficacy of the disclosure, but the experimental content is not intended to limit the scope of the disclosure.

Experimental Examples

In the following experimental examples, the silicon carbide wafer was fabricated with the steps described in FIG. 3. Herein, the flow rate of argon gas and the temperature of vanadium gas were performed in the manner described in Table 1. In the obtained silicon carbide wafer, measurement results of the etch pit density, micropipe density, ratio of the nitrogen concentration to the vanadium concentration, and resistivity are shown in Table 1 as well.

TABLE ONE

| | Experimental Example 1 | Experimental Example 2 | Experimental Example 3 | Experimental Example 4 | Experimental Example 5 | Experimental Example 6 | Experimental Example 7 |
|---|---|---|---|---|---|---|---|
| Vanadium Concentration | $1*10^{17}$ atom/cm$^3$ | $1.2*10^{17}$ atom/cm$^3$ | $3.3*10^{17}$ atom/cm$^3$ | $3.5*10^{17}$ atom/cm$^3$ | $4.02*10^{17}$ atom/cm$^3$ | $4.6*10^{17}$ atom/cm$^3$ | $5*10^{17}$ atom/cm$^3$ |
| Nitrogen Concentration | $2.2*10^{16}$ atom/cm$^3$ | $2.4*10^{16}$ atom/cm$^3$ | $1.5*10^{16}$ atom/cm$^3$ | $5*10^{16}$ atom/cm$^3$ | $4*10^{16}$ atom/cm$^3$ | $7*10^{16}$ atom/cm$^3$ | $5.5*10^{16}$ atom/cm$^3$ |
| Vanadium: Nitrogen Concentration Ratio (V:N) | 4.5:1 | 5:1 | 2:1 | 7:1 | 10:1 | 6:1 | 9:1 |
| resistivity (Ω · cm) | portion greater than $10^{12}$ accounting for 90% | portion greater than $10^{12}$ accounting for 90% | portion greater than $10^{12}$ accounting for 85% | portion greater than $10^{12}$ accounting for 95% | portion greater than $10^{12}$ accounting for 100% | portion greater than $10^{12}$ accounting for 90% | portion greater than $10^{12}$ accounting for 100% |
| Etch Pit Density (ea/cm$^2$) | 7687 | 7831 | 6785 | 7503 | 8354 | 7785 | 8476 |
| Micropipe Density (ea/cm$^2$) | 0.65 | 0.7 | 0.8 | 0.3 | 0.5 | 0.7 | 0.55 |
| Temperature of Vanadium Gas | 2060° C. | 2060° C. | 2250° C. | 2250° C. | 2065° C. | 2050° C. | 2065° C. |
| Flow rate of Argon Gas | 70 sccm | 70 sccm | 80 sccm | 80 sccm | 75 sccm | 80 sccm | 75 sccm |
| Evaluation | good | good | good | good | good | good | good |

| | Experimental Example 8 | Experimental Example 9 | Comparative Example 10 | Comparative Example 11 | Comparative Example 12 | Comparative Example 13 |
|---|---|---|---|---|---|---|
| Vanadium Concentration | $7.5*10^{17}$ atom/cm$^3$ | $9.05*10^{17}$ atom/cm$^3$ | $1.2*10^{18}$ atom/cm$^3$ | $3*10^{16}$ atom/cm$^3$ | $3.3*10^{17}$ atom/cm$^3$ | $4.75*10^{16}$ atom/cm$^3$ |
| Nitrogen Concentration | $9.3*10^{16}$ atom/cm$^3$ | $9*10^{16}$ atom/cm$^3$ | $9.4*10^{16}$ atom/cm$^3$ | $2.2*10^{16}$ atom/cm$^3$ | $2.1*10^{17}$ atom/cm$^3$ | $5.89*10^{16}$ atom/cm$^3$ |
| Vanadium: Nitrogen Concentration Ratio (V:N) | 8:1 | 10:1 | 12.7:1 | 1.4:1 | 1.6:1 | 0.8:1 |

TABLE ONE-continued

| resistivity (Ω · cm) | portion greater than $10^{12}$ accounting for 100% | portion greater than $10^{12}$ accounting for 100% | portion greater than $10^{12}$ accounting for 0% | portion greater than $10^{12}$ accounting for 0% | portion greater than $10^{12}$ accounting for 0% | portion greater than $10^{12}$ accounting for 0% |
|---|---|---|---|---|---|---|
| Etch Pit Density (ea/cm²) | 7320 | 6875 | 16098 | 9923 | 7935 | 9615 |
| Micropipe Density (ea/cm²) | 0.35 | 0.1 | 2.3 | 2.5 | 2.8 | 3 |
| Temperature of Vanadium Gas | 2155° C. | 2235° C. | 2550° C. | 1700° C. | 2060° C. | 1860° C. |
| Flow rate of Argon Gas | 80 sccm | 85 sccm | 200 sccm | 35 sccm | 50 sccm | 20 sccm |
| Evaluation | good | good | not good | not good | not good | not good |

As shown in the experimental results shown in Table One, when the temperature of vanadium gas was within the range of 2,155° C. to 2,250° C., the flow rate of argon gas was within the range of 70 sccm to 85 sccm, and the vanadium/nitrogen concentration ratio (V:N) was adjusted to meet the range of 2:1 to 10:1 through the introduction time of vanadium gas, a silicon carbide wafer exhibiting high resistance uniformity and high resistivity was obtained. As shown in Experimental Example 3, when the process met the conditions of the disclosure and the vanadium/nitrogen concentration ratio (V:N) was at 2:1, the portion of the silicon carbide wafer having a resistivity greater than $10^{12}$ Ω·cm accounted for 85% of the entire wafer area of the silicon carbide wafer. As shown in Experimental Examples 1 to 2 and 6, when the process met the conditions of the disclosure and the vanadium/nitrogen concentration ratio (V:N) was within the range of 4.5:1 to 6:1, the portion of the silicon carbide wafer having a resistivity greater than $10^{12}$ Ω·cm accounted for 90% of the entire wafer area of the silicon carbide wafer. As shown in Experimental Example 4, when the process met the conditions of the disclosure and the vanadium/nitrogen concentration ratio (V:N) was at 7:1, the portion of the silicon carbide wafer having a resistivity greater than $10^{12}$ Ω·cm accounted for 95% of the entire wafer area of the silicon carbide wafer. As shown in Experimental Examples 5 and 7 to 9, when the process met the conditions of the disclosure and the vanadium/nitrogen concentration ratio (V:N) was within the range of 8:1 to 10:1, the portion of the silicon carbide wafer having a resistivity greater than $10^{12}$ Ω·cm accounted for 100% of the entire wafer area of the silicon carbide wafer.

In contrast, as shown in Comparative Example 10, because the temperature when vanadium gas was introduced and the flow rate of argon gas were both excessively high, the vanadium/nitrogen concentration ratio (V:N) exceeded the range of 10:1, and the portion of the silicon carbide wafer having a resistivity greater than $10^{12}$ Ω·cm accounted for 0% of the entire wafer area of the silicon carbide wafer, so the evaluation was not good. Besides, as shown in Comparative Example 11 and the Comparative Example 13, because the temperature when vanadium gas was introduced and the flow rate of argon gas were both excessively low, the vanadium/nitrogen concentration ratio (V:N) was lower than the range of 2:1, and the portion of the silicon carbide wafer having a resistivity greater than $10^{12}$ Ω·cm accounted for 0% of the entire wafer area of the silicon carbide wafer, so the evaluation was not good. Similarly, as shown in Comparative Example 12, if the flow rate of argon gas was excessively low and the nitrogen concentration was excessively high, the vanadium/nitrogen concentration ratio (V:N) was lower than the range of 2:1, and the portion of the silicon carbide wafer having a resistivity greater than $10^{12}$ Ω·cm accounted for 0% of the entire wafer area of the silicon carbide wafer, so the evaluation was not good.

In view of the foregoing, in the silicon carbide wafer formed through the method of fabricating the same provided by the embodiments of the disclosure, gaseous molecules of vanadium are introduced for doping, and the doping concentration of vanadium and the concentration of nitrogen are under a specific proportional relationship. In this way, the silicon carbide wafer may exhibit high resistance uniformity and high resistivity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A silicon carbide wafer, wherein in the silicon carbide wafer, a ratio (V:N) of a vanadium concentration to a nitrogen concentration is in a range of 8:1 to 10:1, and a portion of the silicon carbide wafer having a resistivity greater than $10^{12}$ Ω·cm accounts for more than 85% of an entire wafer area of the silicon carbide wafer, wherein in the silicon carbide wafer, the nitrogen concentration is within a range of $5.5*10^{16}$ atom/cm³ to $9.3*10^{16}$ atom/cm³, and the vanadium concentration is within a range of $5*10^{17}$ atom/cm³ to $9.05*10^{17}$ atom/cm³.

2. The silicon carbide wafer according to claim 1, wherein a micropipe density of the silicon carbide wafer is less than 1 ea/cm².

3. A silicon carbide wafer, wherein in the silicon carbide wafer, a ratio (V:N) of a vanadium concentration to a nitrogen concentration is in a range of 8:1 to 10:1, and a portion of the silicon carbide wafer having a resistivity greater than $10^{12}$ Ω·cm accounts for 100% of an entire wafer area of the silicon carbide wafer, wherein in the silicon carbide wafer, the nitrogen concentration is within a range of $5.5*10^{16}$ atom/cm³ to $9.3*10^{16}$ atom/cm³, and the vanadium concentration is within a range of $5*10^{17}$ atom/cm³ to $9.05*10^{17}$ atom/cm³, and the vanadium concentration within the range of $5*10^{17}$ atom/$cm^3$ to $9.05*10^{17}$ atom/$cm^3$ is achieved by using vanadium gas for doping during fabrication of the silicon carbide wafer.

* * * * *